US006774666B1

(12) United States Patent
Samad

(10) Patent No.: US 6,774,666 B1
(45) Date of Patent: Aug. 10, 2004

(54) METHOD AND CIRCUIT FOR GENERATING A CONSTANT CURRENT SOURCE INSENSITIVE TO PROCESS, VOLTAGE AND TEMPERATURE VARIATIONS

(75) Inventor: Maheen A. Samad, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/306,092

(22) Filed: Nov. 26, 2002

(51) Int. Cl.[7] .................................................. H03K 17/16
(52) U.S. Cl. .............................. 326/32; 326/27; 326/83
(58) Field of Search .............................. 326/26, 27, 31, 326/32, 82, 83, 87

(56) References Cited

U.S. PATENT DOCUMENTS

| | | | | | |
|---|---|---|---|---|---|
| 5,428,303 | A | * | 6/1995 | Pasqualini | 326/27 |
| 6,448,811 | B1 | * | 9/2002 | Narendra et al. | |
| 6,628,558 | B2 | * | 9/2003 | Fiscus | 365/222 |
| 2002/0027470 | A1 | * | 3/2002 | Narendra et al. | 327/541 |

* cited by examiner

*Primary Examiner*—Don Le
(74) *Attorney, Agent, or Firm*—Pablo Meles; Edel M. Young; Justin Liu

(57) ABSTRACT

A method of providing a constant current drive to a driver circuit (40) in a compensating bias circuit (10) includes the steps of providing a constant current source insensitive to process, supply voltage, and temperature variations and mirroring the constant current source to the driver circuit while adding no sensitivity to process, supply voltage, and temperature variations.

28 Claims, 6 Drawing Sheets

METHOD AND CIRCUIT FOR GENERATING A CONSTANT CURRENT SOURCE INSENSITIVE TO PROCESS, VOLTAGE AND TEMPERATURE VARIATIONS

FIELD OF THE INVENTION

This invention relates generally to methods of generating a constant current source and mirroring the constant current source to an integrated circuit that may need a constant current, and more particularly an analog bias circuit using a current source and a mirroring scheme that are both insensitive to process, voltage, and temperature variations.

BACKGROUND OF THE INVENTION

Existing low voltage differential signal (LDVS) systems may use drivers with stacked output transistors providing the current drive necessary for LVDS standards. These existing systems may use a pMOS bias transistor operated in the linear region so that it acts similar to a resistor. A disadvantage to this driver scheme is that the linear region pMOS makes the differential output voltage intolerant to supply voltage variation. The bias-voltage generator in such existing systems inherently cannot control the driver to provide a constant differential voltage when it tries to increase an Nbias voltage to compensate for an increase in the supply voltage, thereby leaving it relatively susceptible to supply variations.

U.S. Pat. No. 6,448,811 by Narenda et al. ("Narenda") discusses a circuit that creates a process-insensitive current source. Narenda, however, does not discuss or focus on circuits that are insensitive to voltage or temperature variations. Narenda utilizes a feedback control system to actively monitor and control the current, and also relies on the use of an external resistor. Basically, Narenda deals with an active method of using a low tolerance external resistor to ensure that on-chip current stays constant across process variations.

Thus a need exists for a bias-voltage generator (and accompanying driver) that increases the tolerance of a driver or other circuit to process, supply voltage, and temperature variations. A current source that is insensitive to process, voltage, and temperature variations may be used in a wide variety of applications.

SUMMARY OF THE INVENTION

According to one embodiment of the present invention, an analog bias circuit uses a process, voltage, and temperature (PVT) insensitive current source and a PVT insensitive mirroring system that can be used to bias low voltage differential signal (LVDS) output drivers and other circuits requiring a PVT insensitive current source. For an LVDS driver, a bias circuit in accordance with the present invention can be designed to allow the LVDS driver to meet the required electrical specifications across process corners (e.g., 3-sigma variation on transistor parameters such as mobility, threshold voltage, channel resistance, etc.), supply voltage (e.g., 2.3V to 2.7V), and temperature (e.g., –50 to 150 degrees Celsius). One aspect of the present invention utilizes the special characteristics of a transistor biased at an optimal gate-source voltage to achieve virtually zero temperature coefficient conductivity, enabling the current source to be independent of temperature variations by balancing the opposing temperature-dependent effects of mobility and threshold voltage.

According to one embodiment of the present invention, the tolerance of a circuit to process, supply voltage, and temperature variations is increased by using a new architecture that uses a current source and at least one mirroring circuit that are insensitive to process, voltage, and temperature variations. In contrast to the circuit described in Narenda, the present invention does not require any feedback type of control. Also, the present invention does not need any external devices to operate.

Although much of the focus of the present invention is on voltage and temperature insensitivity, the present invention also minimizes process sensitivity in the current generator, and has a current mirroring scheme that is very process insensitive as well.

DETAILED DESCRIPTION OF THE DRAWINGS

The present invention primarily involves the creation of a PVT insensitive current source and the mirroring of such PVT insensitive current source to another circuit or circuits that require such current. In creating the PVT insensitive current source, methods and circuits will be discussed for making the current from such current source insensitive to process, voltage, and temperature variations. Ideally, the steps and circuits used to mirror the insensitive current source to another circuit will not add any further sensitivity to process, voltage, or temperature.

Figures 1, 2:
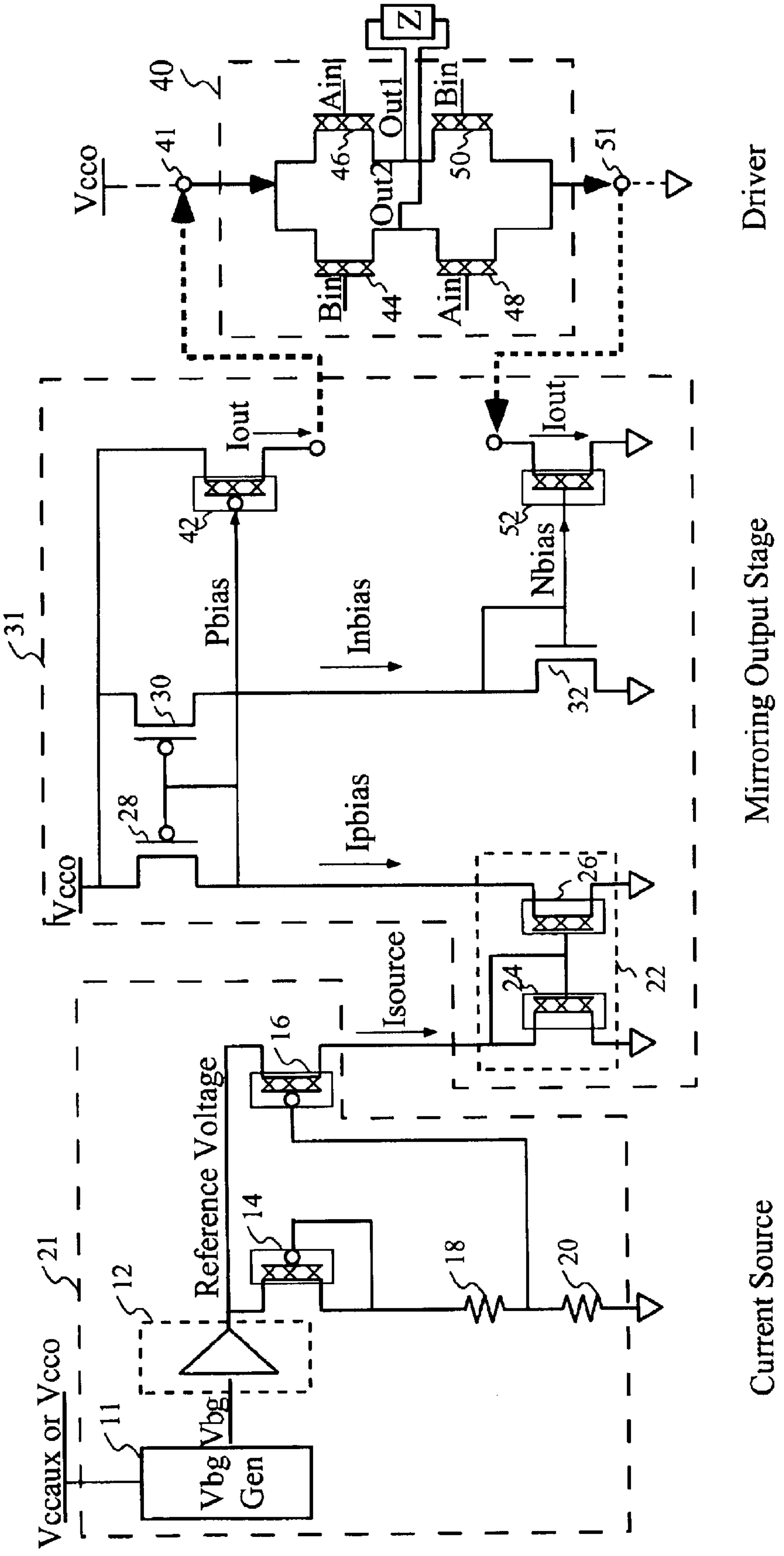
FIG. 1 is a schematic diagram of a bias circuit in accordance with the present invention.
FIG. 2 is a schematic diagram of an integrated circuit such as a driver that operates in conjunction with the bias circuit of FIG. 1 in accordance with the present invention.

Bias-voltage generator or bias circuit 10 shown in FIG. 1 works with an integrated circuit 40 such as the driver shown in FIG. 2 to provide a constant current drive through corners of operation. Note that the bias circuit 10 can work with circuits other than drivers. Basically, any "black box" circuit that is placed between the Nbias-connected output transistor 52 and the Pbias-connected output transistor 42 can serve as the circuit 40 as long as it meets certain criteria. The biasing will work in the best-mode when the top and bottom nodes 41 and 51, respectively, are able to keep the Nbias and the Pbias transistors in the saturation region. The black box circuit 40 can be placed so that it is: (a) connected between the Pbias part of the current mirror and ground (as indicated by the dashed line to ground), (b) connected between the Nbias part of the current mirror and the Vcco power supply (as indicated by the dashed line to Vcco), or (c) connected to both the Pbias and the Nbias parts of the current mirror. All three configurations will allow the black box circuit 40 to get the correct mirrored current.

Figure 3:
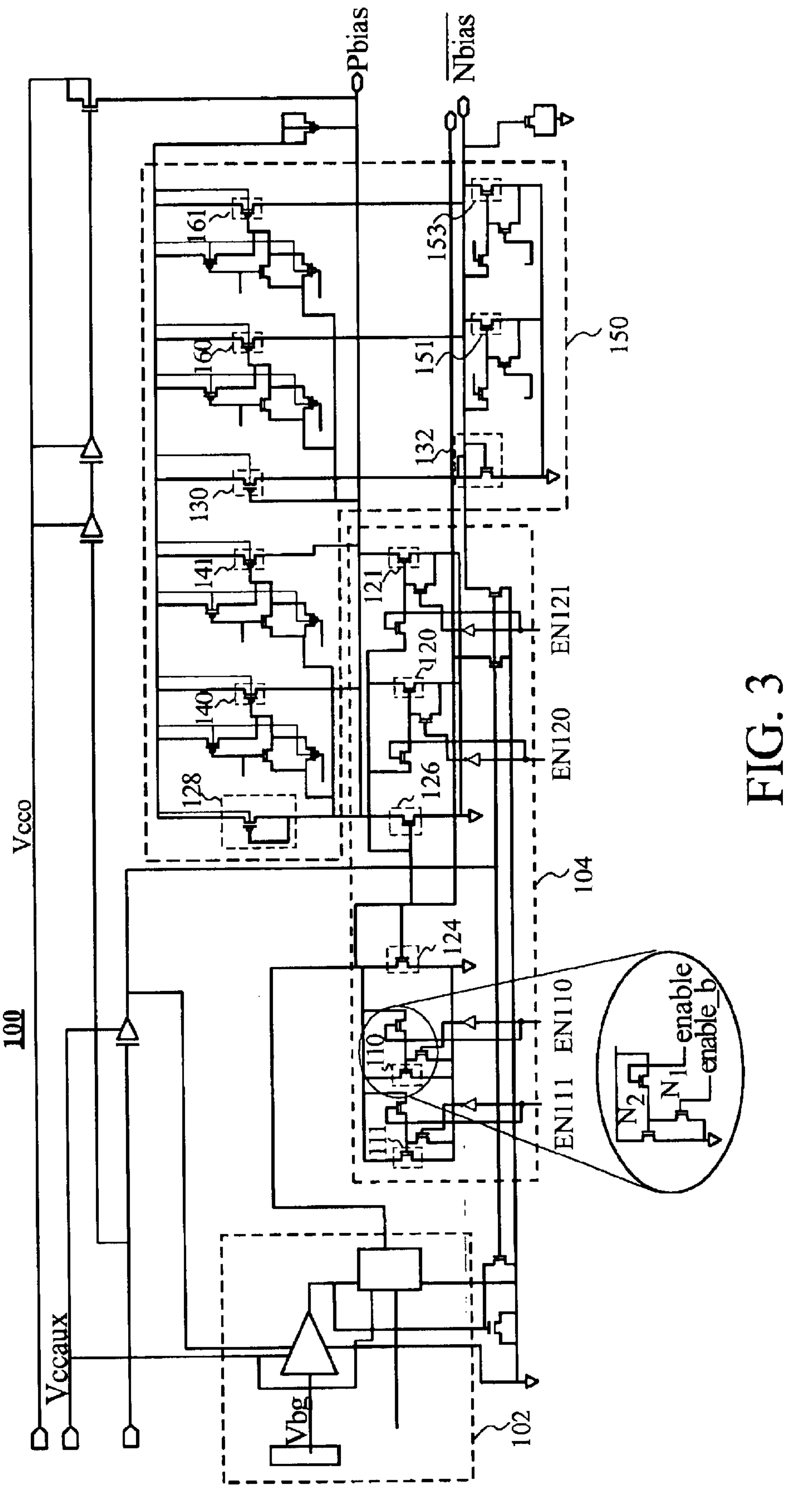
FIG. 3 is a top-level circuit illustration of a bias circuit in accordance with the present invention.

Note that bias circuit 10 can be considered a simplified block diagram because it does not show the gain, output, and current source options, as will be discussed further with respect to FIG. 3. As mentioned above, the bias circuit 10 preferably includes a current source stage 21 and a mirroring output stage 31. The current source stage preferably includes bandgap voltage generator 11, voltage buffer 12, transistors 14 and 16, and resistors 18 and 20, arranged as shown in FIG. 1. The mirroring output stage preferably includes a gain stage 22 (having transistors 24 and 26 (and other optional transistors as seen in FIG. 3)) and transistors 28, 30, and 32. In addition, the mirroring output stage can include output driver transistors 42 and 52, although these can easily be included as part of circuit 40 instead. As discussed above, circuit 40 can be any circuit requiring a constant current source. In this instance, circuit 40 includes transistors 44, 46, 48, and 50 coupled as shown in FIG. 2. This coupling of circuit 40 is used as the output driver for LVDS standards that require a resistive termination, as shown, that requires a constant current to create a controllable differential voltage across the differential resistive termination Z.

Referring to FIG. 3, a top level circuit illustration of a bias circuit 100 similar to the bias circuit 10 of FIG. 1 is shown where the circuit includes a current source stage 102, a gain stage 104, and an output stage 150 with additional circuitry showing the various programmable elements of the bias circuit (i.e., Gain stage, Nbias output stage, and Pbias output stage; Current source options are not included in this figure).

Referring to FIG. 1, current (Isource) generated by the current source (21) is insensitive to supply voltage variations because the initial current is obtained from a reference source such as a bandgap reference Vbg provided by a bandgap voltage generator 11. Although a bandgap reference is preferred, it should be understood that an off-chip reference or any other good stable voltage reference can also be used. The bandgap reference is preferably designed to be a voltage source that is most insensitive to supply voltage and temperature variations. The bandgap generator for this system should be designed to produce a voltage Vbg that will result in a zero-temperature-coefficient for pMOS transistor 16 (as described below). Ideally, the bandgap reference is tied to an auxiliary voltage Vccaux that is subject to substantially less variation than the supply voltage (Vcco). The bandgap generator 11 can alternatively be referenced to Vcco (a noisy output driver voltage supply) and still provide good insensitivity to Vcco, but the best mode operation would reference the bandgap to a less noisy power supply signal. In this instance, the auxiliary voltage Vccaux is likely the least noisy signal available. The bandgap reference is supplied to a voltage buffer 12, which is also preferably powered by the least noisy power supply available, to provide a buffered bandgap voltage. Both the well and source of pMOS transistors 14 and 16 are attached directly to the buffered bandgap voltage, or "reference voltage," and the respective gates of transistors 14 and 16 are referenced off from a ratio of the buffered bandgap voltage, so the current through transistor 16 remains fairly insensitive to Vcco voltage variations. When the supply voltage (Vcco) changes, the bandgap voltage will stay relatively constant, providing constant control voltages for the pMOS transistor 16.

Figure 4:
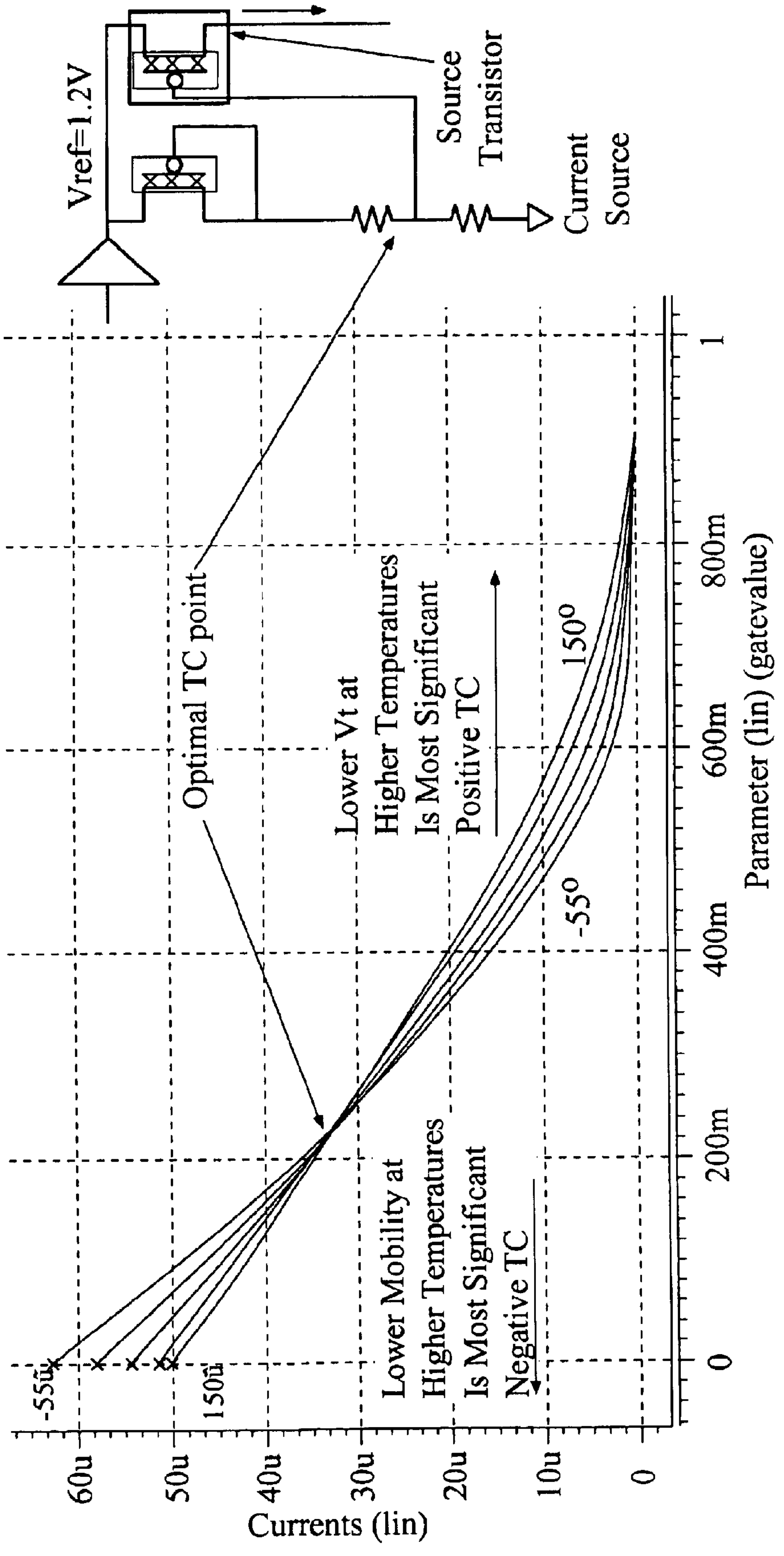
FIG. 4 is a graph illustrating an optimal temperature coefficient point in accordance with the present invention.

The current source (Isource) is insensitive to temperature variations because the pMOS transistor 16 is biased at an optimal gate-source voltage where the temperature coefficient TC is at or near zero, as shown in FIG. 4. The graph of FIG. 4 basically reflects the current (vertical axis) through the pMOS transistor at a given gate voltage (horizontal axis) when the voltage at the source terminal of the transistor is 1.2V (the reference voltage). Ultimately, source-to-gate voltage (Vref minus Vgate) is most important. Curves are shown for several temperatures to show the different temperature coefficients at different gate voltages with the optimal zero-TC point occurring when gate voltage is around 220 mV (for a reference voltage equal to 1.2V). To the right of the point there is more current at higher temperature (we can call this positive TC for the pMOS device current) and to the left of the point there is less current at higher temperature (we can call this negative TC for the pMOS device current).

This phenomenon occurs because the temperature dependent threshold voltage (Vt) and carrier mobility effects balance each other at this source-gate voltage. At higher temperatures the required threshold voltage to turn on the pMOS device decreases (threshold voltage applies to voltage seen between the gate and the source of a transistor), as seen on the right side of the graph. Here, to the right of the optimal TC point, for a given gate-source voltage, the current is higher at a higher temperature, showing that the temperature coefficient for the device current is a positive value when the gate voltage is above 220 mV (meaning the source-gate voltage is below 980 mV (1.2V–0.22V)). Therefore the effects of temperature dependent threshold voltage variation dominate for bias source-gate voltages less than approximately 980 mV with the given process (note that this optimal point may vary with process corners). An opposite temperature behavior is seen for bias voltages higher than 980 mV. The mobility of the carriers within the pMOS device decreases with higher temperature, contributing to a decrease in the conductance of the device at higher temperatures. Therefore, to the left of the optimal zero-TC point, at higher bias voltages, the effects of decreased carrier mobility overcome the threshold voltage effects and cause the current to decrease with increasing temperature. This gives a negative TC for the pMOS device current at bias voltages greater than 980 mV. The optimal zero-TC source-gate bias point is chosen for pMOS 16 in this current source circuit to provide a current that is insensitive to temperature variations.

Figure 6:
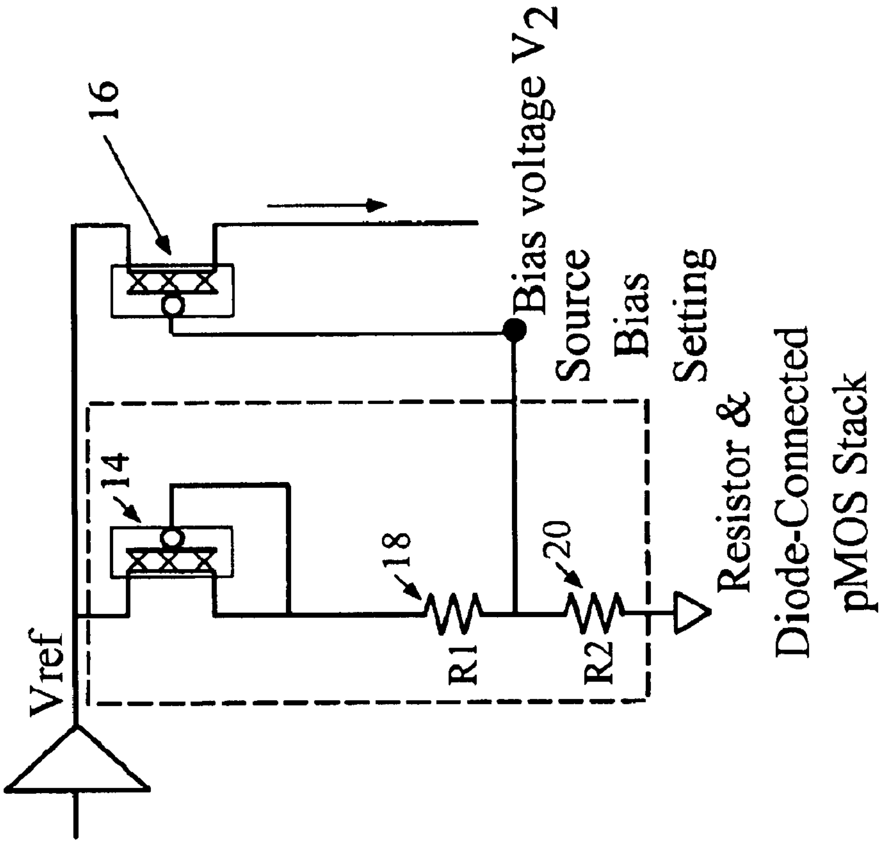
FIG. 6 is a schematic diagram portion of the current source circuit of the bias circuit of FIG. 1.
Figure 5:
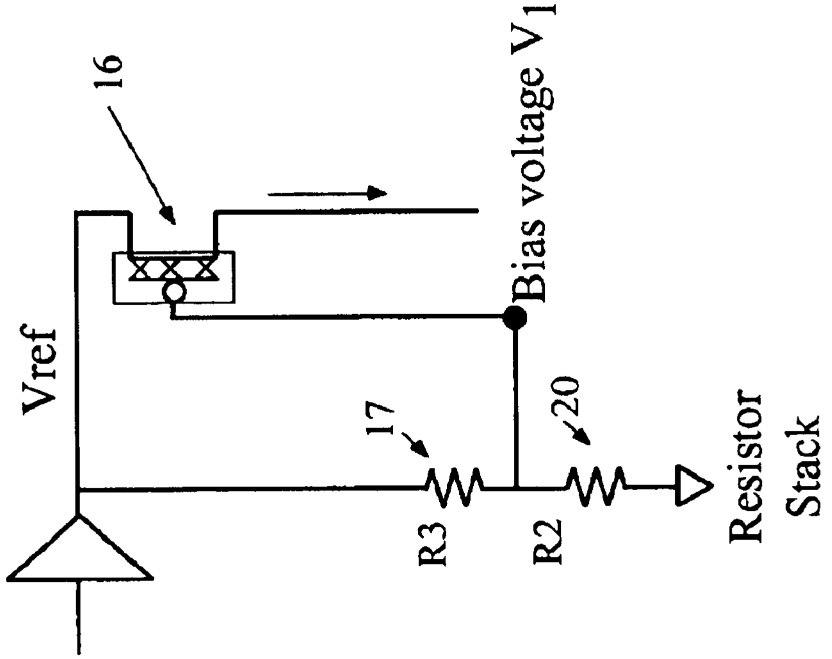
FIG. 5 is a schematic diagram portion of a current source that could be used with of the bias circuit of FIG. 1 in accordance with the present invention.

In creating a PVT insensitive current source that is particularly insensitive to process parameters, several embodiments can be used to obtain adequate results. In a first embodiment, the source transistor 16 can be biased with a simple resistor stack as shown in FIG. 5 or biased with a resistor stack and diode connected pMOS as shown in FIG. 6. The term "diode connected," as used herein, refers to a transistor that has its gate tied to its drain, such that the gate-to-source voltage and the drain-to-source voltage are equal. The diode connected pMOS version of FIG. 6 gives better insensitivity to process variations while the pure resistor stack of FIG. 5 gives better insensitivity to temperature variations.

In the embodiment of FIG. 5, a pure resistor stack (17 and 20) is shown. Process variations in the pMOS 16 will not match process variations in the resistor stack, but the ratioed resistor stack will hold a stable bias voltage (for pMOS 16) better than the stack that includes pMOS 14 shown in FIG. 6. This happens because both resistors will share the same temperature coefficient and therefore the resistive ratio that determines the bias voltage V1 will not change as temperature changes. Temperature will affect all components in the stack in a similar manner, increasing or decreasing the conductance by a certain percentage, and therefore maintaining a constant bias voltage at the optimal voltage illustrated in FIG. 4.

In the embodiment of FIG. 6, a resistor stack (18 and 20) with diode connected pMOS 14 is shown. With temperature variations, the bias voltage given to pMOS 16 will vary slightly because the stack includes resistors and the diode connected pMOS 14 (temperature affects the conductance of each of these in a different manner resulting in a very slight voltage shift on the bias voltage V2 with temperature changes). FIG. 6 illustrates a diode connected pMOS transistor 14 coupled through resistor 18 to pMOS transistor 16 that allows pMOS 16 to track better with process variations. This structure provides a tradeoff with temperature variation by using a resistor stack (18 and 20) that provides a more stable voltage across temperature. Again, the advantage over the embodiment of FIG. 5 is that the diode connected pMOS 14 allows the bias stack (pMOS 14, resistor 18 (R1), and resistor 20 (R2)) to track better with process variations in the pMOS 16. This happens because the pMOS 14 varies along with the pMOS 16 (both have similar physical properties when pMOS 16 is spatially close to pMOS 14), whereas in the embodiment of FIG. 5, pMOS 16 varies independently of any of the resistors.

For example, if a certain batch of wafers from a fabrication foundry has threshold voltages that are higher than normal, pMOS 14 and 16 both have higher threshold voltages so pMOS 14 helps to compensate for process variations and increase the source-gate bias voltage of pMOS 16, whereas the pure resistive stack (as shown in FIG. 5), being independent of transistor process variations, would not compensate pMOS 16, resulting in less source-gate voltage and lower current output from pMOS 16.

Figure 7:
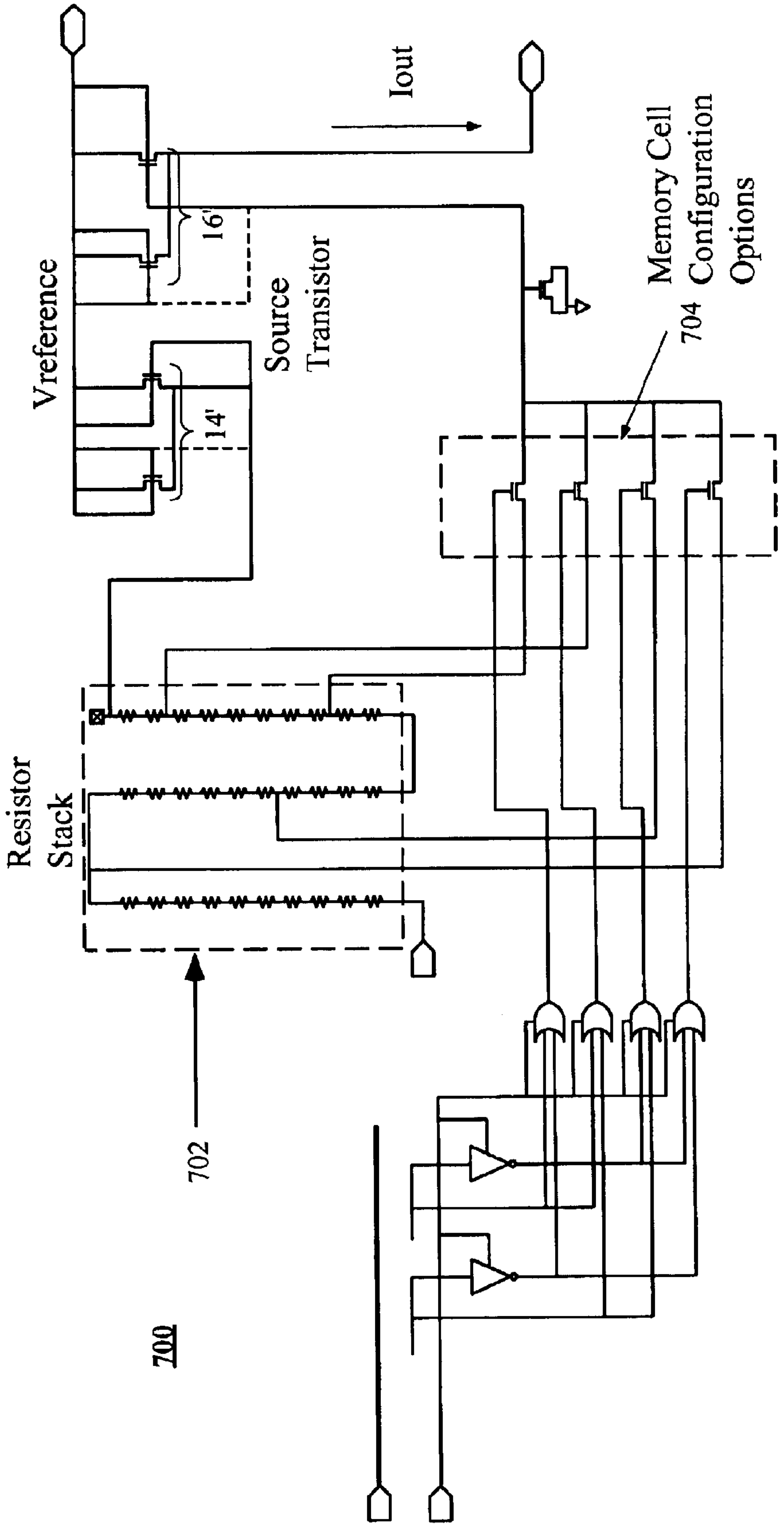
FIG. 7 is a more detailed current source schematic providing the function of the bias circuit portion of FIG. 6 in accordance with the present invention.

In yet another embodiment for creating a PVT insensitive current source, a circuit 700, as shown in FIG. 7, provides options to choose among different ratios for the bias voltage using MOS transistors 704 that are set so that only one is turned on in any configuration. They are connected from a resistor stack 702 to the gate of pMOS 16' (analogous to pMOS transistor 16 of FIG. 6). Setting the selection signal (shown as memory-cell controlled selection signals, but not required to be) allows the user to control what voltage is placed to bias pMOS 16'. Note that pMOS transistor 14' is also analogous to pMOS transistor 14 of FIG. 6. This embodiment adds flexibility with an easily programmable option.

In the mirroring aspect of the present invention, the insensitive current created (as described above) is ideally mirrored to a circuit requiring it without adding further sensitivity. Referring once again to FIG. 1, the Pbias mirror and the Nbias mirror are referenced together to provide the same current on the output driver by tying the gates of transistors 28 and 30 together and connecting transistor 30 to transistor 32. A mirror is formed between transistors 28 and 30 where transistor 28 is the input transistor and transistor 30 is the output transistor. Another mirror is between transistors 28 and 42 where transistor 28 is the input and transistor 42 is the output (the input has its gate attached to its own drain). Because of the current mirror, Ipbias is equal to Inbias (or a constant times Inbias if transistors 28 and 30 have different widths). Transistor 28 is the input to transistor 42 so that Iout (the current going through the driver circuit) is a ratioed version of the current through transistor 28. Assuming the output transistor 42 is wider, this ratio causes a current gain, as with all current mirrors, as set by the ratio of widths of transistors 42 and 28. The ratio of w42/w28 may be adjustable depending on current needs of the circuit. (This can be considered a second gain stage, however this second gain stage is not programmable.)

A similar situation occurs with the Nbias mirror between transistors 32 and 52. If in the case of transistors 28 and 30, the ratio of w30/w28 equals one, equal current flows through Ipbias and Inbias. The current that is provided by the initial pMOS current source is mirrored for one stage to allow a gain stage that may be altered for different needs on the output. Then, the current can go to the Pbias-voltage generator where the Pbias voltage is used for the drivers. This same current is mirrored to the Nbias-voltage generator (32). Since the Nbias and Pbias-voltage generators are the input stages to current mirrors, the driver bias transistors (42 and 52) act like output stages to current mirrors.

The driver bias transistors 42 and 52 should be considered as part of the output stage because they are on the output side of the current mirror that starts with transistors 28 and 32. Note that the mirroring output stage can also connect to a circuit that only uses the Nbias transistor 52 and a connection to Vcco, or a circuit that only uses the Pbias transistor 42 and a connection to the ground power supply. The lengths are preferably matched on these transistor devices for optimal matching to reduce process variations that may occur. The only variations that these current mirrors are subjected to are due to variations in the original current source. The general idea of tolerant current generation from this circuit may be used in many applications where a constant current is necessary. The concept found in this bias circuit can be applied in other compensating bias circuits.

Mirroring the insensitive current source to a circuit (40) needing it under the present invention will involve a gain stage, and a mirroring output stage that adds no process, voltage, and temperature sensitivity. Gain stage 22 of FIG. 1 or gain stage 104 of FIG. 3 need to provide current levels greater or less than the current that is provided by the optimally biased pMOS transistor (the PVT insensitive current source). Memory-cell controlled select signal options EN110, EN111, EN120, and EN121 (enabling branches on either side in FIG. 3) allow configuration of this gain, and flexibility to change the setting on the physical device to allow someone to increase or decrease gain settings as desired. The gain stage 22 preferably comprises transistors 24 and 26 that are adaptable as shown by transistors in stage 104 of FIG. 3.

The mirrored current Ipbias depends upon the adaptability of transistors in the gain stage 22 for its adaptability. Isource does not depend on the transistors in the gain stage because it is the source current derived in the current source 10. Source current Isource is the starting current that gets mirrored through the gain ratio to produce Ipbias.

The ratio of Ipbias to Isource is adjusted by enabling and disabling the transistors 110 (FIG. 3) and 120 (and others such as 111 and 121 as necessary) in gain stage 104. Enabling the transistors changes the ratio of the current mirror, which adjusts the amount of current gain seen through the gain stage. Enabling the option transistors on the right side (120 and 121) increases the gain ratio while enabling the option transistors on the left (110 and 111) decreases the gain ratio. Sizes are carefully chosen on the option transistors to take advantage of all the possible combinations of the four option enable signals (EN110, EN111, EN120, EN121) giving $2^4$=16 different gain ratio settings from only a few option transistors. When "enable" is high and "enable_b" is low, the transistor (N2) is enabled to increase the effective width of the left side. When enable is low and enable_b is high, this transistor is disabled and the effective width is not increased. This takes advantage of binary coding of the enable signals. Deliberate sizing allows these 16 settings to cover the range between minimum gain and maximum gain with a pattern that places more settings near the original target setting that is in the middle of the range. Transistors 124 and 126 function similar to transistors 24 and 26 of bias circuit 10 of FIG. 1.

The options are enabled as shown in the exploded view portion in FIG. 3. Enabling the option transistor entails enabling an nMOS pass transistor (for nMOS options) (shown in exploded view) or transmission gate (for pMOS options) (no exploded view shown) to pass the necessary gate voltage to the gate of the option transistor (N2), while disabling the option transistor entails coupling its gate to GND (for nMOS options) or vcco (for pMOS options) through either an nMOS transistor (nMOS options) or pMOS transistor (pMOS options).

In FIG. 3, stub ends of gate control lines for the enable/disable circuits are connected to configuration memory cells not shown. In the output stage 150 of FIG. 3, memory bit control is used to adjust the output stage current mirror ratio by turning on and off the various optional transistors (shown in dashed lines 140, 141, 161, 160, 151, 153). These pMOS and nMOS options are enabled by the use of pass transistors or transmission gates as described above. Transistors 128, 130, and 132 function similar to transistors 28, 30, and 32 of bias circuit 10 of FIG. 1.

It should be noted that Pbias and Nbias output stage operation provides flexibility to use different sized output transistors (transistors 42 and 52 providing current to the driver or any other "black box" circuit placed between them) to provide the same current. This is because the actual voltage Pbias and Nbias may be increased or decreased through the use of the options, allowing different sizes that yield the same current. Again, for best mode operation, the voltages should be adjusted to operate transistors 42 and 52 in the saturation region. As explained above with the mirror ratios, the final mirror stage acts like a constant gain stage.

It should also be noted that the memory options let the value of Pbias and Nbias change while still allowing the same current to flow through the mirroring stage and the output circuit. The Pbias value and Nbias value are each independently adjustable. For instance, decreasing the effective size of transistors 28 and 30 will increase the source to gate voltage of transistor 42 but not affect the gate to source voltage of transistor 52. Similarly, changing the effective size of transistor 32 will affect the nbias voltage but not affect the Pbias voltage. Through any option adjustment, transistors 28 and 30 should have equal size to ensure that Inbias and Ipbias are equal.

Figure 8:
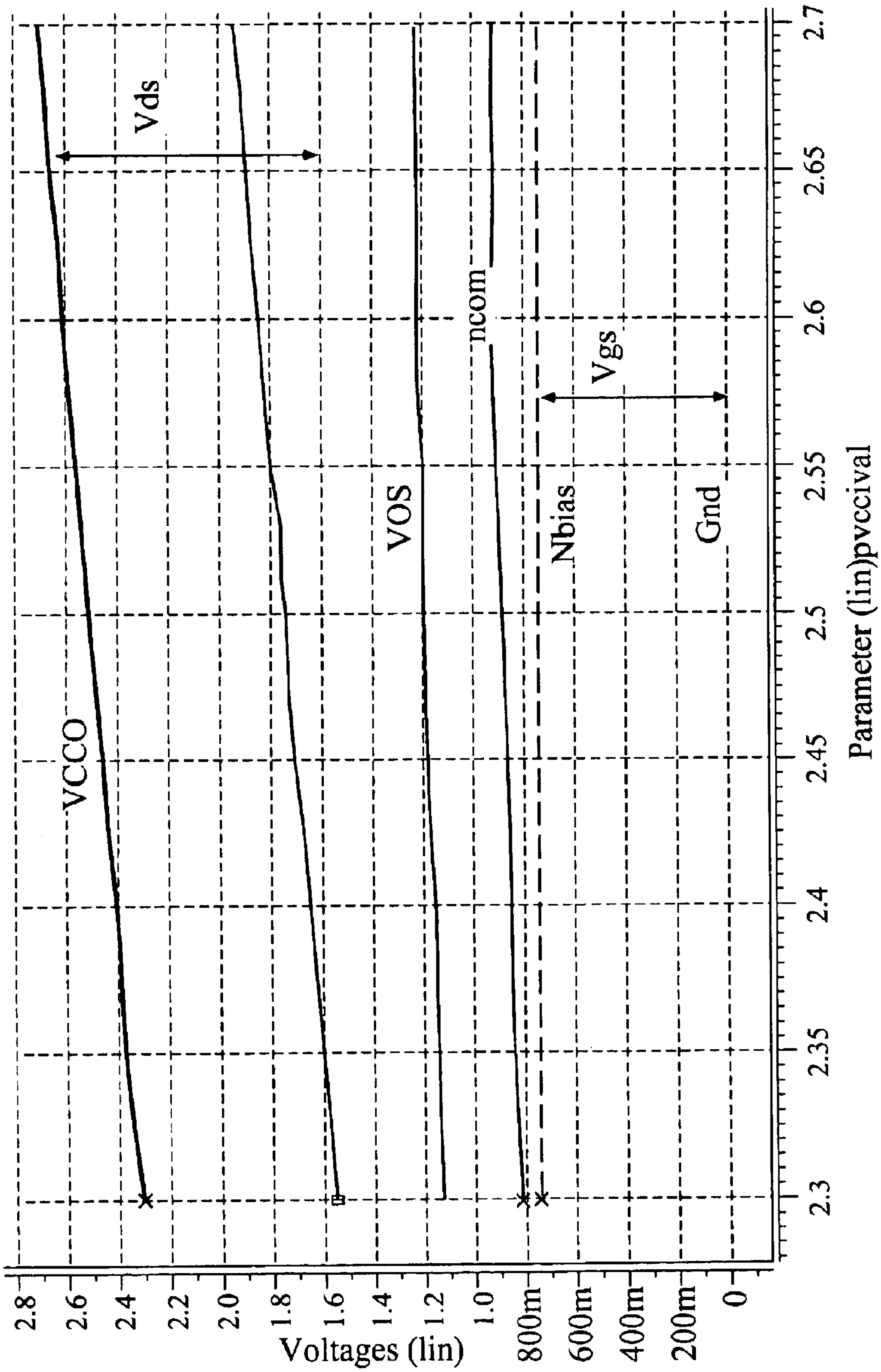
FIG. 8 is a graph illustrating Pbias and Nbias voltages across supply voltage variations in accordance with the present invention.

The mirroring stage should add no voltage sensitivity. The circuit using the constant current and the output stage within the bias circuit need to be referenced to the same power voltage and the same ground voltage for the mirroring output stage to perform properly. The Nbias signal is referenced to ground, so the end circuit should also be referenced to the same ground. This ensures the same gate to source voltage for transistor 32 and transistor 52. When the end circuit transistor pMOS 42 and the output stage pMOS transistor pMOS 28 of the bias circuit are referenced to the same power supply voltage (Vcco) there is little sensitivity to voltage variations. (See FIG. 8, where Pbias and Nbias are depicted across supply voltage variations.) The Pbias voltage is referenced to Vcco so even when Vcco is a noisy driver voltage, it should be used for both circuits so that the noise affects pMOS 28 and pMOS 42 to the same degree. The best mode operation entails that the output transistors are operating in the saturation region ((|Vdrain−Vsource|)>(|Vgate−Vsource|−Vthreshold)). In this region of operation, the current through the transistor is more dependent on the gate to source voltage and less dependent on the drain to source voltage. In the linear region of operation ((|Vdrain−Vsource|)<(|Vgate−Vsource|−Vthreshold)) the drain to source voltage significantly affects the channel current of the transistor. Since the bias circuit mirroring stage controls the output current through manipulation of the gate-source voltage, it is preferred for the output transistors 42 and 52 to operate in the saturation region where their current is a strong function of gate-source voltage.

The mirroring stage should add no temperature or process sensitivity as well. The lengths of these mirroring devices are the same to ensure proper matching. With similar spatial location on the mirroring devices (input transistor and output transistor), the threshold voltage, mobility, channel resistance, and other physical properties should vary equally on input and output stages due to process variations. Likewise, similar spatial location on the mirroring devices causes similar temperature on both input and output transistors so that they perform similarly. Therefore, the mirror structure adds no temperature or process sensitivity. Note that providing transistors in both the bias circuit and the driver in close proximity to each other further makes mirroring current across such circuits more insensitive to process and temperature variations.

The description above is intended by way of example only and is not intended to limit the present invention in any way, except as set forth in the following claims.

What is claimed is:

1. A method of providing a constant current drive to a circuit by using a compensating bias circuit, comprising the steps of:

providing a constant current source that is insensitive across process, supply voltage, and temperature variations; and mirroring the constant current source to the circuit while adding no sensitivity to process, supply voltage, and temperature variations.

2. The method of claim 1, wherein the step of providing the constant current source comprises the step of providing a reference voltage by performing one of the steps selected from the group of buffering a bandgap voltage, using an off-chip reference voltage, or using a stable reference voltage.

3. The method of claim 1, wherein the step of mirroring the constant current source comprises the step of using memory bit control to control a size of a Pbias transistor in the bias circuit relative to a Pbias transistor in the circuit.

4. The method of claim 1, wherein the step of mirroring the constant current source comprises the step of using memory bit control to control a size of an Nbias transistor in the bias circuit relative to an Nbias transistor in the circuit.

5. The method of claim 2, wherein the buffered bandgap voltage is insensitive to the supply voltage variation and is insensitive to the temperature variation.

6. The method of claim 2, wherein the step of providing the constant current insensitive to the supply voltage variation comprises the steps of:

attaching a well and a source of a pMOS transistor to a buffered bandgap voltage; and referencing a gate of the pMOS transistor from a ratio of the buffered bandgap voltage to maintain constant current through the pMOS transistor.

7. The method of claim 1, wherein the step of mirroring comprises mirroring the constant current source across an adaptable gain stage of the compensating bias circuit.

8. The method of claim 7, wherein the step of mirroring further comprises mirroring constant current source across an output stage of the compensating bias circuit.

9. The method of claim 1, wherein the step of providing a constant current source insensitive across process variations comprises using a first MOSFET transistor to compensate for a second MOSFET transistor.

10. The method of claim 3, wherein the Pbias transistor provides a Pbias voltage and an Nbias transistor provides an Nbias voltage and the step of mirroring enables independent programmable control over the Pbias and Nbias voltages.

11. The method of claim 1, wherein the step of mirroring enables programmable control over current level through a gain stage.

12. A method of providing a constant current with a compensating bias circuit, comprising the steps of:

providing the constant current to a driver circuit insensitive to a supply voltage variation;

providing the constant current to the driver circuit insensitive to a temperature variation; and providing the constant current to the driver circuit insensitive to a process variation.

13. The method of claim 12, wherein the compensating bias circuit is a low voltage differential signal (LVDS) output driver bias circuit.

14. The method of claim 12, wherein the step of creating the constant current insensitive to a temperature variation comprises biasing a MOSFET transistor to an optimal voltage where the temperature coefficient remains substantially at zero.

15. The method of claim 12, wherein the step of providing the constant current insensitive to process, voltage, and temperature variation comprises referencing a Pbias mirror and an Nbias mirror together to provide the same current to the driver circuit.

16. The method of claim 15, wherein the step of providing the constant current insensitive to the process, voltage, and temperature variation comprises mirroring the current provided by an initial pMOS current source for one stage to allow a gain stage to be altered as needed on an output.

17. The method of claim 16, wherein the step of providing the constant current insensitive to the process, voltage, and temperature variation further comprises providing the current provided by the initial pMOS current source to a Pbias voltage generator to provide a Pbias voltage input to the driver circuit.

18. The method of claim 17, wherein the step of providing the constant current across the process, voltage and temperature variation further comprises mirroring the current provided by the initial pMOS current source to an Nbias-voltage generator to provide an Nbias-voltage input to the driver circuit.

19. A method of providing a constant current with a compensating bias circuit, comprising the step of: creating the constant current insensitive to temperature variation by biasing a pMOS transistor to an optimal voltage where a temperature coefficient of the pMOS transistor remains substantially at zero.

20. A compensating bias circuit, comprising:

a biasing portion comprising a pMOS transistor having a reference voltage signal applied to a well and a source of the pMOS transistor and having a ratio of the reference voltage signal applied to a gate of the pMOS transistor, wherein the pMOS transistor is biased at a voltage where a temperature coefficient remains substantially at zero.

21. The compensating bias circuit of claim 20, wherein the compensating bias circuit further comprises:

a Pbias voltage generator to provide a Pbias voltage to drive a Pbias transistor in an output circuit; and an Nbias voltage generator receiving a common current, wherein the Pbias voltage generator and the Nbias voltage generator are input stages to current mirrors in the output circuit and wherein a Pbias mirror and an Nbias mirror are referenced together to provide the common current to the output circuit.

22. A compensating bias circuit, comprising:

a biasing portion comprising a pMOS transistor having a buffered bandgap voltage signal applied to a well and a source of the pMOS transistor and having a ratio of the buffered bandgap voltage signal applied to a gate of the pMOS transistor, wherein the pMOS transistor is biased at a voltage where a temperature coefficient remains substantially at zero;

a Pbias voltage generator to provide a Pbias voltage to drive a Pbias transistor in an output circuit; and an Nbias voltage generator receiving a common current, wherein the Pbias voltage generator and the Nbias voltage generator are input stages to current mirrors in the output circuit and wherein a Pbias mirror and an Nbias mirror are referenced together to provide the common current to the output driver.

23. The compensating bias circuit of claim 22, wherein the compensating bias circuit is a low voltage differential signal bias circuit.

24. The compensating bias circuit of claim 22, wherein the at least one driver bias transistors have lengths that are matched optimally with the biasing portion.

25. A temperature and process insensitive current source comprising:

a reference voltage source providing a reference voltage;

a voltage divider generating a divided voltage; and a transistor receiving the reference voltage at a source terminal and a well terminal, and the divided voltage at a gate terminal, and providing the current source at a drain terminal.

26. The current source of claim 25 wherein the reference voltage source comprises a bandgap generator.

27. The current source of claim 25 wherein the voltage divider comprises a plurality of resistors.

28. The current source of claim 25 wherein the voltage divider comprises a diode connected transistor.

* * * * *